(12) United States Patent
Matsusue et al.

(10) Patent No.: US 7,508,005 B2
(45) Date of Patent: Mar. 24, 2009

(54) LIGHT EMITTING DISPLAY APPARATUS WITH SLIGHT COLOR SHIFTING

(75) Inventors: Noriyuki Matsusue, Hirakata (JP); Kunimoto Ninomiya, Hirakata (JP)

(73) Assignee: Sanyo Electric Co., Ltd., Osaka (JP)

( * ) Notice: Subject to any disclaimer, the term of this patent is extended or adjusted under 35 U.S.C. 154(b) by 181 days.

(21) Appl. No.: 11/079,528

(22) Filed: Mar. 15, 2005

(65) Prior Publication Data

US 2005/0212414 A1 Sep. 29, 2005

(30) Foreign Application Priority Data

Mar. 25, 2004 (JP) ............................. 2004-089131

(51) Int. Cl.
*H01L 33/00* (2006.01)
(52) U.S. Cl. ..................................... 257/89
(58) Field of Classification Search .................. 257/89
See application file for complete search history.

(56) References Cited

U.S. PATENT DOCUMENTS

| | | | |
|---|---|---|---|
| 5,554,911 A * | 9/1996 | Nakayama et al. | 313/504 |
| 6,133,692 A * | 10/2000 | Xu et al. | 313/506 |
| 6,406,801 B1 * | 6/2002 | Tokito et al. | 428/690 |
| 6,707,067 B2 * | 3/2004 | Zhong et al. | 257/59 |
| 7,030,553 B2 * | 4/2006 | Winters et al. | 313/504 |

FOREIGN PATENT DOCUMENTS

JP 2003-257622 A 9/2003

OTHER PUBLICATIONS

Hsu, S.F., et al., "Fabrication of blue top-emitting organic light-emitting devices with highly saturated color", Current Applied Physics, 2004, vol. 4, p. 663-6.*
Tokito, S., et al., Hight peformance organic electroluminescent diodes with microcavities, Electronics Letters., Mar. 28, 1996, vol. 32, No. 7, p. 691-2.*

* cited by examiner

*Primary Examiner*—Howard Weiss
(74) *Attorney, Agent, or Firm*—McDermott Will & Emery LLP

(57) ABSTRACT

A light emitting display apparatus that achieves color display by using white light as a light source includes a plurality of organic light emitting devices each of which includes an organic light emitting layer that emits the white light. The organic light emitting device is configured so that a resonant wavelength in a thickness direction of the organic light emitting layer is positioned in the blue region of the spectrum. The light emitting display apparatus further includes a plurality of wavelength selection units each of which is provided on a path of the emission of the white light. The wavelength selection unit transmits light of a particular wavelength included in the white light.

6 Claims, 8 Drawing Sheets

CHROMATICITY DIAGRAM

FIG.7

CHROMATICITY DIAGRAM

FIG.8

CHROMATICITY DIAGRAM

LIGHT EMITTING DISPLAY APPARATUS WITH SLIGHT COLOR SHIFTING

BACKGROUND OF THE INVENTION (1) Field of the Invention

The present invention relates to a light emitting display apparatus of a top emission type, particularly to a technique to enhance visibility.

(2) Description of the Prior Art

In recent years, light emitting display apparatuses in which self-luminous devices are driven using thin-film transistors (hereinafter referred to as TFTs) attract attention, because of their ability to realize display apparatuses having high efficiency, high definition, low power consumption, and high-speed response. One type of such light emitting display apparatuses is top-emission organic electroluminescence panels (hereinafter referred to as organic EL panels), and vigorous researches are conducted on top-emission organic EL panels. In a top-emission organic EL panel, organic light emitting devices formed on a TFT substrate emit light. This light is emitted in a direction opposite to a direction through the substrate in which TFTS, wirings and the like are formed. As a result, the light is extracted from a "top" side of the panel highly efficiently.

This top-emission organic EL panel achieves color display in the following manner, as disclosed in Japanese patent application publication No. 2003-257622, for example. The organic light emitting devices emit white light to the "top" side. Color filters, which are provided in the direction of the light emission, selectively transmit and separate three primary colors composing the white light. Such a top-emission organic EL panel has advantages including a high luminous efficiency and a bright display on a screen, in addition to distinct features of general organic EL panels such as a thin panel and a wide viewing angle.

However, the top-emission organic EL panel has the following drawback. In the top-emission organic EL panel, an organic light emitting layer, which actually emits the light, is sandwiched between highly reflective layers. Therefore, the emitted light resonates, so that light of a particular wavelength is enhanced. Which is to say, a resonant structure is formed. Here, the resonant wavelength is different depending on an angle with respect to a direction perpendicular to a display unit of the panel. Accordingly, the color of the light emitted from the organic light emitting layer appears different for a user between when the user watches the display unit in the direction perpendicular to the display unit and when the user watches the display unit in a direction having an angle with respect to the perpendicular direction. This drawback is called color shifting.

In more detail, when the user watches the display unit of the light emitting display apparatus having a resonant structure in the direction having an angle with respect to the direction perpendicular to the display unit, a resonant wavelength in the direction in which the user watches the display unit is shifted to a shorter wavelength, in comparison with a resonant wavelength in the direction perpendicular to the display unit. In accordance with this change, a wavelength of light received by the user (hereinafter referred to as received light) is shifted to a shorter wavelength, and an intensity of the received light also changes. These changes cause color shifting.

SUMMARY OF THE INVENTION

In view of the above problem, an object of the present invention is to provide a top-emission light emitting display apparatus which hardly causes color shifting even when a user watches a display unit in a direction having an angle with respect to a direction perpendicular to the display unit.

The above object can be achieved by a light emitting display apparatus that achieves color display by using white light as a light source. The light emitting display apparatus includes a plurality of organic light emitting devices each of which includes an organic light emitting layer that emits the white light. The organic light emitting device is configured so that a resonant wavelength in a thickness direction of the organic light emitting layer is positioned in the blue region of the spectrum. The light emitting display apparatus further includes a plurality of wavelength selection units each of which is provided on a path of the emission of the white light. The wavelength selection unit transmits light of a particular wavelength included in the white light.

According to this construction, the resonant wavelength in the thickness direction of the organic light emitting layer, i.e. an inherent resonant wavelength, is positioned in the blue region of the spectrum. Suppose a user watches a display unit in a direction having an angle with respect to the direction perpendicular to the display unit. A resonant wavelength in the direction in which the user watches the display unit is shifted to a shorter wavelength, when compared with the inherent resonant wavelength. In accordance with this change, the intensities of green light and red light included in light received by the user are reduced, but the reduction is limited. This is because the wavelengths of the green light and red light in the received light are positioned far away from the inherent resonant wavelength. As a result, the shift of the wavelengths and the reduction in the intensities are limited, as for the green and red light in the received light.

Since the resonant wavelength in the direction in which the user watches the display unit is shifted to a shorter wavelength, the wavelength of blue light included in the received light is shifted to a shorter wavelength. In addition, the intensity of the blue light peaks at a shorter wavelength, and is raised.

Here, while the intensity of the blue light in the received light becomes higher at a shorter wavelength, part of the blue light is included in the ultraviolet region which indicates less visibility. For this reason, the change in the intensity of the blue light in the received light appears to be limited for the user.

Thus, even when the user watches the display unit in the direction having an angle with respect to the direction perpendicular to the display unit, the change in luminance of the blue, green and red light in the received light is moderate. This causes only slight color shifting.

Here, the blue region of the spectrum may indicate a wavelength range of 400 nm to 520 nm, inclusive.

According to this construction, when the angle increases, the height of the intensity peak of the blue light in the received light increases, but the intensity-wavelength distribution of the blue light is partly included in the ultraviolet region. Thus, the amount of the visible blue light is lowered. As a consequence, the increase in the intensity of the blue light appears to be limited for the user.

Here, the resonant wavelength preferably fall within a range of 400 nm to 450 nm, inclusive.

According to this construction, the inherent resonant wavelength is set at a shorter wavelength, within the blue region. Therefore, the intensity-wavelength distribution of the blue light is easy to be included in the ultraviolet region, in accordance with the increase in the angle. This makes it easier to alleviate the increase in the intensity peak of the blue light, which is caused by the increase in the angle. As a result, color shifting is further limited.

Here, the wavelength selection unit is a color filter that transmits light of a corresponding one of three primary colors.

According to this construction, color shifting, which is caused by the increase in the angle, is limited in a normal light emitting display apparatus that achieves color display in such a manner that three primary colors of light mix, thereby emitting white light.

Here, at least one of a thickness of the organic light emitting layer, a refractive index of the organic light emitting layer, and a phase shift φ of the organic light emitting layer is adjusted so that the resonant wavelength in the thickness direction of the organic light emitting layer is positioned in the blue region of the spectrum.

According to this construction, the inherent resonant wavelength in the thickness direction of the organic light emitting layer is positioned in the blue region of the spectrum.

BRIEF DESCRIPTION OF THE DRAWINGS

These and other objects, advantages, and features of the invention will become apparent from the following description thereof taken in conjunction with the accompanying drawings, which illustrate a specific embodiment of the invention. In the drawings.

DESCRIPTION OF THE PREFERRED EMBODIMENT

<Construction>

Figure 1:
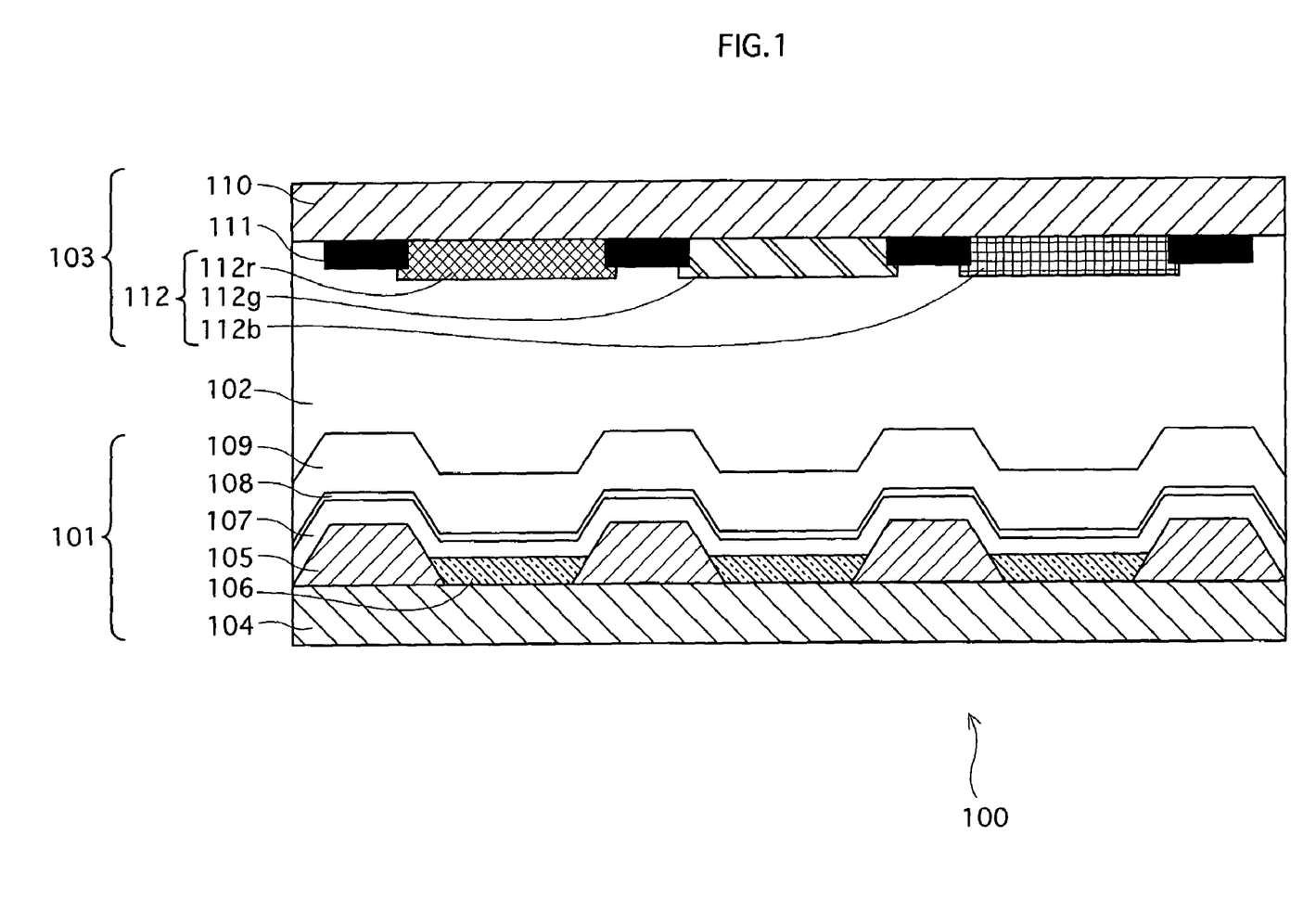
FIG. 1 is a schematic cross-sectional view illustrating an organic EL panel relating to an embodiment of the present invention.

FIG. 1 is a schematic cross-sectional view illustrating an organic EL panel, which is an example of a top-emission light emitting display apparatus, relating to an embodiment of the present invention.

An organic EL panel 100 relating to the embodiment of the present invention is formed in such a manner that self-luminous organic light emitting devices 101 and a color filter substrate 103 are opposed each other with a sealing layer 102 therebetween, as shown in FIG. 1. The color filter substrate 103 includes a plurality of color filter groups 112.

The color filter substrate 103 is formed in such a manner that the plurality of color filter groups 112 are disposed on a surface of a transparent substrate 110.

The transparent substrate 110 is made of glass, and has a thickness of approximately 0.5 mm to 1.0 mm. Alternatively, the transparent substrate 110 may be a plastic film.

The color filter groups 112 each include color filters 112r, 112g, and 112b, each of which transmits light of a corresponding one of three primary colors. The color filters 112r, 112g and 112b have a thickness of approximately no less than 1 μm but no more than 10 μm. In addition, black matrices 111 are provided between adjacent color filters.

Here, the color filters 112r, 112g and 112b may be formed in stripes, or in a matrix so that each color filter corresponds to a subpixel of a pixel.

The black matrices 111 are each a black film having a thickness of 1 μm to 6 μm. The black matrices 111 are provided to prevent light from leaking into adjacent subpixels, so that intended colors are precisely expressed.

The sealing layer 102 fills an internal space between the color filter substrate 103 and the organic light emitting devices 101. The sealing layer 102 thus limits interfusion of oxygen, moisture and the like from outside. Also, the sealing layer 102 reduces reflection of light at an interface of the organic light emitting devices 101, thereby transmitting light emitted from the organic light emitting devices 101 to the color filter groups 112 efficiently.

The sealing layer 102 is made of a material which transmits visible light, and has a refractive index of 1.3 to 2.5. For example, the sealing layer 102 can be made of an organic material such as transparent silicone rubber, transparent silicone gel, an epoxy resin, and an acryl resin.

The organic light emitting devices 101 are formed in the following manner. A plurality of TFTs (not illustrated in FIG. 1), which are covered with a planarized insulating film (not illustrated in FIG. 1), are provided on one of the main surfaces of a TFT substrate 104. An insulation layer 105 is formed like a lattice, so as to surround each of the TFTs. A film-like anode 106 is formed in each area surrounded by the insulation layer 105. An organic layer 107 including a light emitting layer, a cathode 108 and a protection layer 109 are formed in this order so as to cover the TFT substrate 104, the insulation layer 105, and the anode 106.

The anode 106 is made of a material with a high work function in order to perform hole injection efficiently. Specifically speaking, the anode 106 includes a transparent conductive metal oxide layer made of ITO, IZO or the like. It is preferable to form a highly reflective metal layer under the metal oxide layer. The metal layer is made of, for example, chrome, silver, platinum, or an alloy including any of chrome, silver and platinum.

If the metal layer is formed, an interface between the metal layer and the metal oxide layer is a first reflective surface forming a resonant structure.

If the metal layer is not formed, an interface between the anode 106 and the TFT substrate 104 is the first reflective surface forming the resonant structure. This is because the TFT substrate 104 in contact with the anode 106 reflects light to a certain degree.

In the following description, the metal layer is assumed not to be provided.

Figure 2:
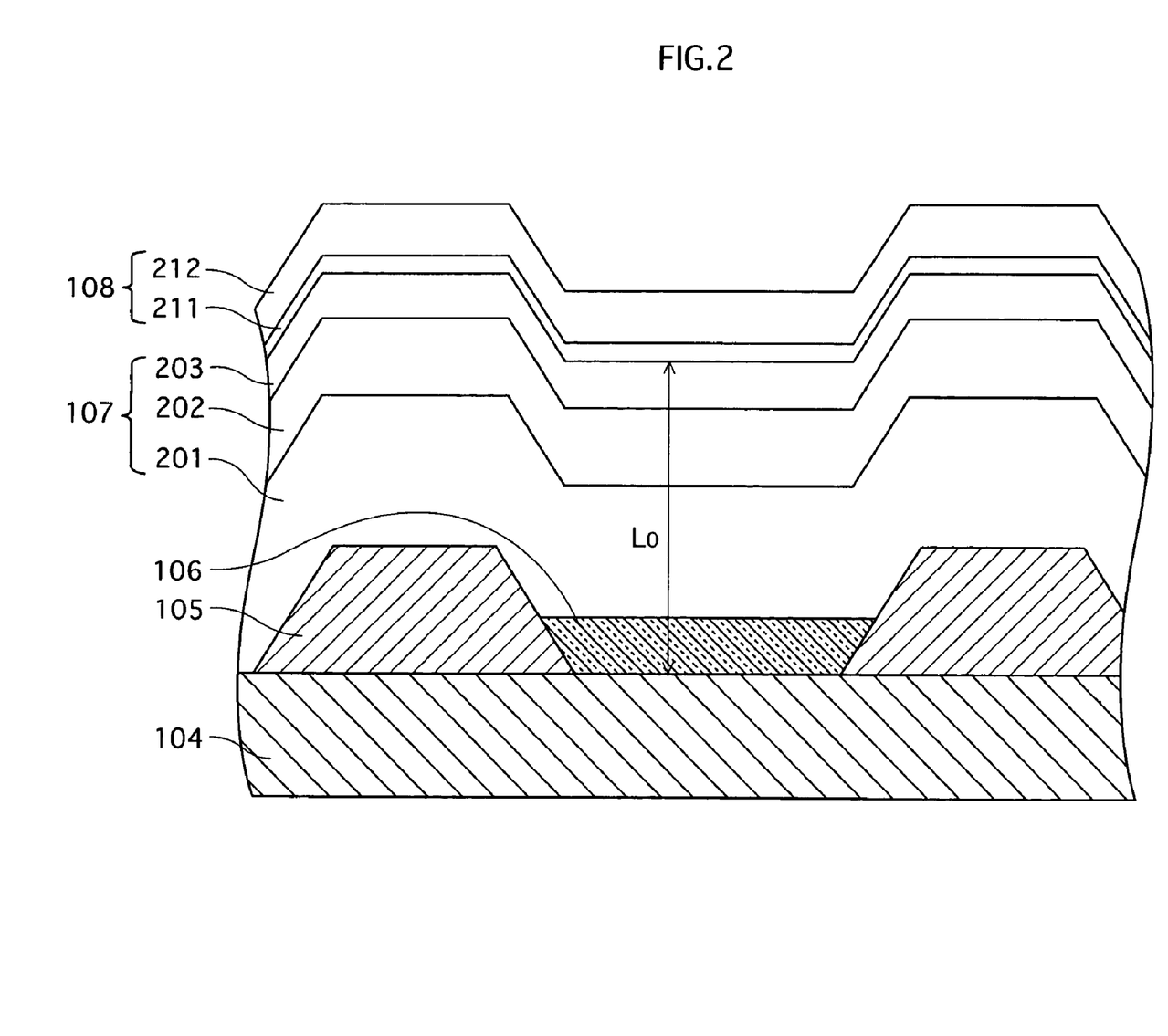
FIG. 2 is a cross-sectional view illustrating, in detail, an organic layer and a cathode electrode relating to the embodiment of the present invention.

As shown in FIG. 2, the cathode 108 has a two-layer structure made up by a semi-transparent electrode 211 and a transparent electrode 212.

The transparent electrode 212 is formed on the semi-transparent electrode 211. The transparent electrode 212 is made of translucent metal oxide such as ITO and IZO.

The semi-transparent electrode 211 is formed on the organic layer 107. The semi-transparent electrode 211 partly transmits light from the organic layer 107, and partly reflects the light.

The semi-transparent electrode 211 is formed by a thin metal film or the like having a thickness of 200 angstroms or less, and having a low work function. To be specific, the semi-transparent electrode 211 is made of, for example, metal such as aluminum, calcium, magnesium, silver, gold, an alloy of lithium or the like and these types of metal, and an alloy of magnesium and silver.

It should be noted that an interface between the semi-transparent electrode 211 and the organic layer 107 is a second reflective surface forming the resonant structure.

The protection layer 109 is a thin-film layer that covers and protects a surface of the transparent electrode 212. The protection layer 109 is made of a material which is highly transparent for visible light, electrically insulative, and resistant against moisture, oxygen and the like. To be specific, the protection layer 109 can be made of, for example, $SiO_x$, $SiN_x$, $AlO_x$ and the like, and formed using sputtering, vapor deposition, a chemical vapor deposition (CVD) method or the like.

The organic layer 107 is formed by a hole transport layer 201, an organic light emitting layer 202, and an electron transport layer 203, in this order (shown in FIG. 2).

The hole transport layer 201 is a path for holes that are injected from the anodes 106, and move to the organic light emitting layer 202 in accordance with application of a voltage between the anode 106 and the cathode 108.

The hole transport layer 201 is made of a material such as N,N'-Di(naphthalene-1-yl)-N,N'-diphenyl-benzidine: NPB, 4,4',4''-tris(3-methylphenylphenylamino)triphenylamine: MTDATA, and N,N'-diphenyl-N,N'-di(3-methylphenyl)-1,1'biphenyl-4,4'-diamine:TPD.

The electron transport layer 203 is a path for electrons that are injected from the cathode 108, and move to the organic light emitting layer 202 in accordance with application of a voltage between the anode 106 and the cathode 108.

The electron transport layer 203 is made of a material such as aluminum-quinoline complex ($Alq_3$) and bis(10-hydroxybenzo[h]quinolinato)beryllium:$Bebq_2$.

The organic light emitting layer 202 emits white light in the following manner. Electrons and holes respectively move towards the organic light emitting layer 202, and are recombinated at an interface between the hole transport layer 201 and the organic light emitting layer 202, at an interface between the electron transport layer 203 and the organic light emitting layer 202, or within the organic light emitting layer 202. The recombination generates an energy, which excites electrons of organic molecules in the organic light emitting layer 202. When the excited electrons are relaxed, white light is emitted.

Here, to emit white light in this way, the organic light emitting layer 202 is a lamination made up of an organic layer that emits blue light and an organic layer that emits orange light, for example. This is because orange is complementary to blue.

The organic light emitting layer 202 is made of a material such as aluminum-quinoline complex ($Alq_3$) and bis(10-hydroxybenzo[h]quinolinato)beryllium:$Bebq_2$ containing quinacridon derivative.

(Design of the Organic EL Panel 100)

The organic EL panel 100 relating to the embodiment of the present invention is designed so that a resonant wavelength falls within the blue region of the spectrum, differently from a conventional organic EL panel that is designed without taking a resonant wavelength into account.

It is generally accepted that a resonant wavelength $\lambda_0$, an optical distance $L_0$ between reflective surfaces forming a resonant structure, and a phase shift $\phi$ have a relation defined by the following equation 1. Considering this, to set the resonant wavelength of the organic light emitting devices 101 within the blue region (400 nm to 520 nm), the value of the resonant wavelength $\lambda_0$ is first set within this range. After this, the values of the optical distance $L_0$ and the phase shift $\phi$ are determined so as to satisfy the equation 1. Based on the obtained values of the optical distance $L_0$ and the phase shift $\phi$, the organic EL panel 100 is designed.

$$2L_0/\lambda_0 + \phi/(2\pi) = m \quad \text{[EQUATION 1]}$$

$L_0$: optical distance between reflective surfaces forming a resonance structure $\lambda_0$: resonant wavelength (nm)

$\phi$: phase shift (Rad)

m: integer

The following more specifically describes how to design the organic EL panel 100. The values of the resonant wavelength $\lambda_0$ and the integer m are determined by designers during the designing process. The resonant wavelength $\lambda_0$ is set so as to take a value within a wavelength range of the blue region, i.e. no less than 400 nm but no more than 520 nm (preferably no less than 400 nm but no more than 450 nm).

The integer m is normally set to zero or one.

The phase shift $\phi$ indicates a phase shift that is generated when light produced by the organic layer 107 is reflected by the surfaces forming the resonant structure. The phase shift $\phi$ is determined by materials forming constituents composing the optical path and surface properties of interfaces.

The value of the phase shift $\phi$ can be obtained in the following manner.

First, a refractive index $n_1$ and an absorption coefficient k of the anode 106 on the TFT substrate 104 are obtained using spectroscopic ellipsometry measurement.

Subsequently, a refractive index $n_2$ of the hole transport layer 201, which is in contact with the anode 106, is also obtained using spectroscopic ellipsometry measurement.

Based on the refractive index $n_1$, the absorption coefficient k, and the refractive index $n_2$, the phase shift $\phi$ is obtained by means of a method disclosed in a known document (Journal of Applied Physics, Vol. 80 (1996) p6954). In detail, respective phase shifts of the two interfaces forming the resonant structure are obtained and added together. The sum of the addition is the phase shift $\phi$.

The optical distance $L_0$ is not a physical distance, but an optically calculated distance between the above-mentioned first and second reflective surfaces. In the present embodiment, the optical distance $L_0$ is obtained based on a product of a thickness and a refractive index of each of 1) the transparent conductive metal oxide layer forming the anode 106, 2) the hole transport layer 201, 3) the organic light emitting layer 202, and 4) the electron transport layer 203.

For example, when the layers 1) to 4) respectively have thicknesses of 1) 800 angstroms, 2) 650 angstroms, 3) 700 angstroms, and 4) 100 angstroms, and have refractive indexes of 1) 2.2, 2) 1.7, 3) 1.7, and 4)1.7, the optical distance $L_0$ is 437 nm.

Here, if the value of $(\phi/2\pi)$ is −0.7, the resonant wavelength $\lambda_0$ is calculated as 515 nm from the equation 1.

In this case, the resonant wavelength $\lambda_0$ is positioned within the blue region. However, to set the resonant wavelength within a more preferable range of no less than 400 nm but no more than 450 nm, the value of the optical distance $L_0$, in other words, the thickness and refractive index of each of the layers 1) to 4), may be changed. Alternatively, the value of the phase shift $\phi$ may be changed. Thus, the obtained resonant wavelength $\lambda_0$ can be approximated to a desired wavelength.

As explained above, the resonant wavelength $\lambda_0$ is first set at a certain value, and the values of the optical distance $L_0$ and the phase shift $\phi$ are adjusted afterwards.

Both of the values of the optical distance $L_0$ and the phase shift $\phi$ can be adjusted to take any values, as long as the resonant wavelength $\lambda_0$ takes a desired value as a result. However, it is more realistic to adjust the value of the optical distance $L_0$, as the value of the optical distance $L_0$ is in the same term as the value of the resonant wavelength $\lambda_0$ according to the equation 1.

(Cause of Color Shifting)

The following describes a cause of color shifting.

The relation defined in the equation 1 is true for a resonance light emitting display apparatus, which is represented by the top-emission organic EL panel 100. Strictly speaking, however, the resonant wavelength $\lambda_0$ is a resonant wavelength in a thickness direction of the organic light emitting layer 107, i.e. in a direction perpendicular to the display unit of the panel 100.

Figure 3:
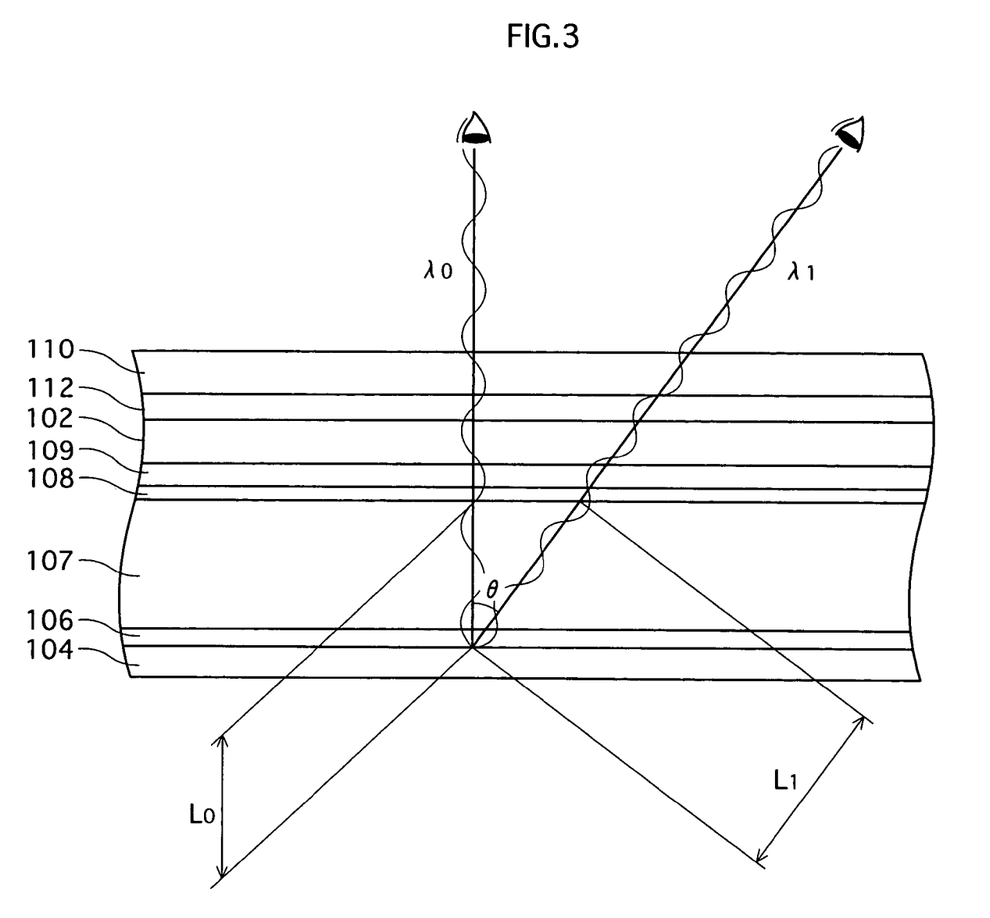
FIG. 3 illustrates a relation between an angle of an optical path and a resonant wavelength of light on the optical path.

As shown in FIG. 3, if the user watches the display unit of the organic EL panel 100 in a direction having an angle of θ degrees with respect to the direction perpendicular to the display unit, the user sees light that runs, in a path at the angle of θ degrees, within the organic layer 107.

In the case of this light, the optical distance between the reflective surfaces forming the resonant structure is a distance $L_1$. Therefore, a resonant wavelength $\lambda_1$ in this direction is defined based on the following equation.

$$2L_1/\lambda_1 + \phi/(2\pi) = m \quad \text{[EQUATION 2]}$$

$\lambda_1$: resonant wavelength (nm) in the direction having the angle of θ degrees with respect to the direction perpendicular to the display unit $L_1$: optical distance between the reflective surfaces forming the resonance structure on the optical path at the angle of θ degrees $\phi$: phase shift (Rad)

m: integer

The phase shift $\phi$ and the integer m take the same values as in the equation 1.

The following equation shows a relation between the optical distances $L_0$ and $L_1$.

$$L_1 = L_0/\cos\theta \quad \text{[EQUATION 3]}$$

The following equation can be obtained based on the relations defined by the equations 1, 2 and 3.

$$2L_0/(\lambda_1 \cos\theta) + \phi/(2\pi) = m \quad \text{[EQUATION 4]}$$

$L_0$: optical distance between the reflective surfaces forming the resonance structure in the direction perpendicular to the display unit $\lambda_1$: resonant wavelength (nm) in the direction having the angle of θ degrees with respect to the direction perpendicular to the display unit $\phi$: phase shift (Rad)

m: integer

According to the equations 2, 3 and 4, the larger the angle of the optical path of the received light becomes with respect to the direction perpendicular to the display unit, the shorter wavelength the resonant wavelength is shifted to. Because of this relation, the wavelength of the light that runs through the optical path having an angle with respect to the direction perpendicular to the display unit has its peak in intensity at a shorter wavelength, when compared with the wavelength of the light that runs in the direction perpendicular to the display unit. At the same time, the height of the intensity peak, that is to say, the intensity is different.

As explained above, the light has a different resonant wavelength depending on an angle of its optical path with respect to the direction perpendicular to the display unit. For better intelligibility, the resonant wavelength in the direction perpendicular to the display unit, i.e. in the thickness direction of the organic layer 107 is hereinafter referred to as an inherent resonant wavelength.

The following explains a correlation among the wavelength and intensity of the light emitted from the organic layer 107 (hereinafter referred to as a light source wavelength and a light source intensity), a position of the inherent resonant wavelength, and the wavelength and intensity of the light that is actually received by the user (hereinafter referred to as an output wavelength and an output intensity).

Figure 4A:
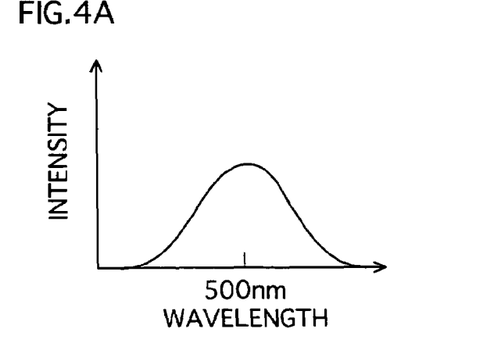
FIG. 4 illustrates a relation among a light source wavelength, a light source intensity, a resonant wavelength, an output wavelength, and an output intensity.
Figure 4B:
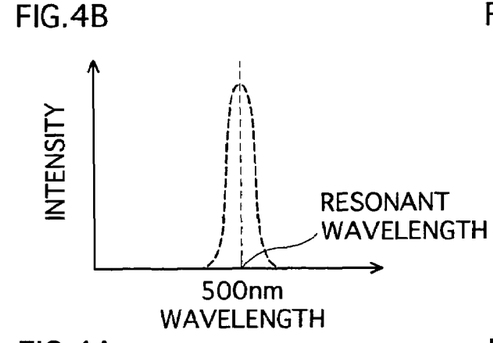
Figure 4C:
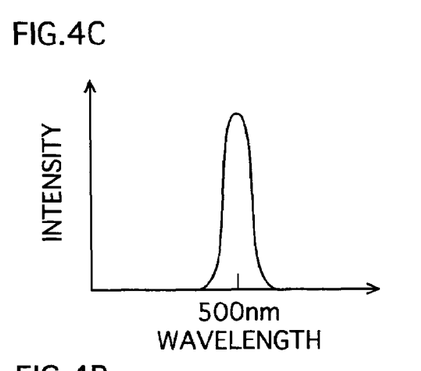

FIGS. 4A, 4B and 4C are used in order to illustrate the above correlation that is observed when the light source wavelength coincides with the inherent resonant wavelength.

In detail, FIG. 4A illustrates a relation between a wavelength and an intensity of emitted light. FIG. 4B illustrates a position of a resonant wavelength. FIG. 4C illustrates a relation between a wavelength and an intensity of received light, which is observed when the conditions illustrated in FIGS. 4A and 4B are combined.

As shown in FIGS. 4A to 4C, when the wavelength of the emitted light coincides with the resonant wavelength, the intensity of the received light is increased, to be larger than the intensity of the emitted light.

Figure 4D:
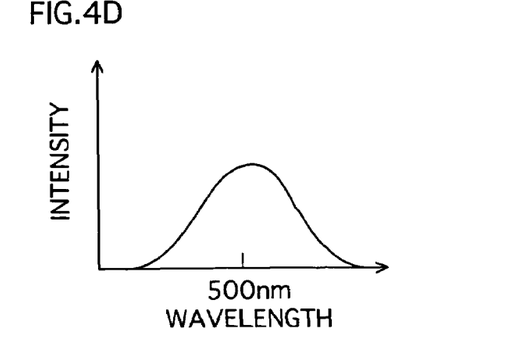
Figure 4E:
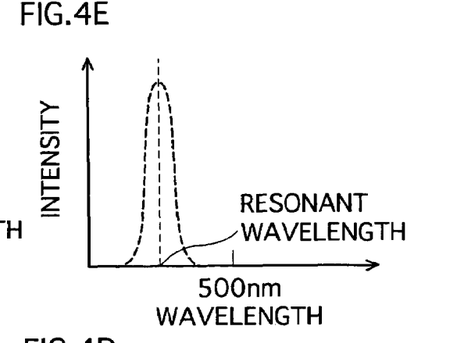
Figure 4F:
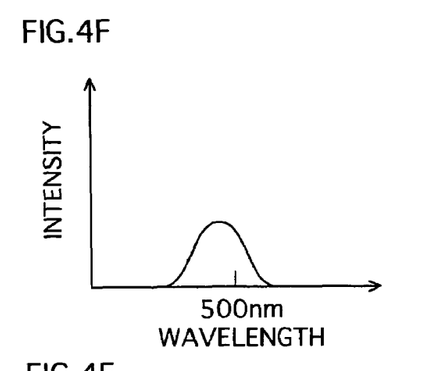

On the other hand, FIGS. 4D, 4E and 4F are used in order to illustrate the above correlation that is observed when the light source wavelength does not coincide with the inherent resonant wavelength.

In detail, FIG. 4D illustrates a relation between a wavelength and an intensity of emitted light. FIG. 4E illustrates a position of a resonant wavelength. FIG. 4F illustrates a relation between a wavelength and an intensity of received light, which is observed when the conditions illustrated in FIGS. 4D and 4E are combined.

In this case, the intensity of the received light is lower than the intensity of the emitted light, and the peak in intensity of the received light is shifted to be closer to the resonant wavelength. Here, the difference in intensity between the emitted light and the received light is smaller, when compared with a case where the wavelength of the emitted light coincides with the resonant wavelength.

(Motive to Set the Inherent Resonant Wavelength)

Such correlations led the inventors of the present invention to discover that color shifting, which occurs when the user watches the display unit of the panel 100 in the direction having an angle with respect to the direction perpendicular to the display unit, can be limited, by setting the inherent resonant wavelength of the organic light emitting devices 101 within the blue region of the spectrum.

This discovery is described in detail in the following.

Figure 5A:
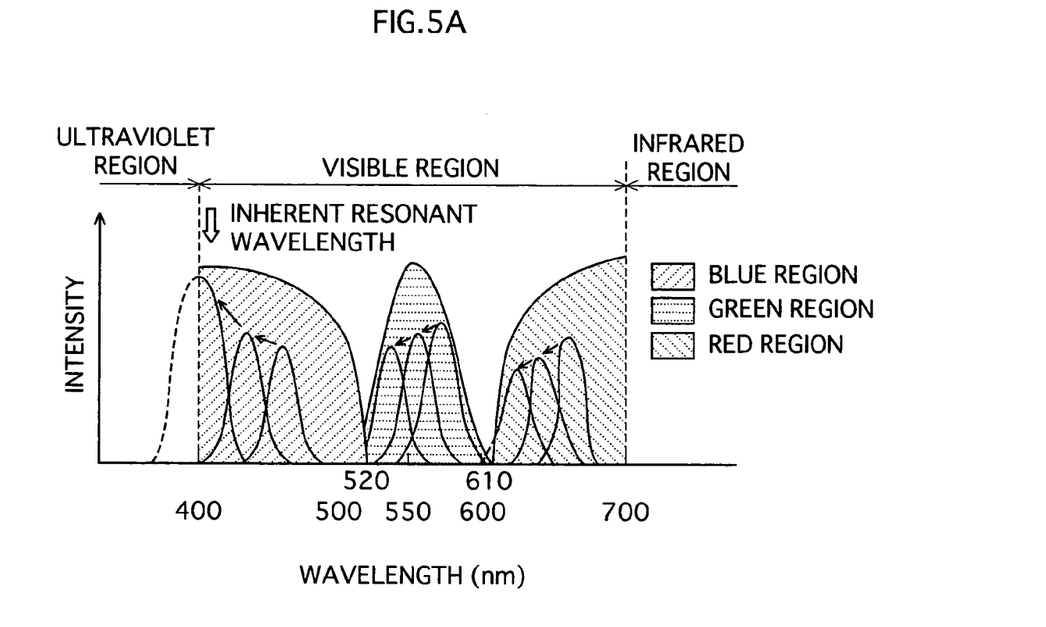
FIG. 5 illustrates an output wavelength and an output intensity of light of each of three primary colors, when an angle of a direction in which a user watches a display unit increases with respect to a direction perpendicular to the display unit.

FIG. 5A illustrates a transition of the wavelength of the light received by the user, when the angle of the direction in which the user watches the display unit gradually increases with respect to the direction perpendicular to the display unit.

The light emitted from the organic layer 107 is white light composed of three primary colors, that is to say, including red light, green light, and blue light.

FIG. 5A also shows optical transmission characteristics of the color filters 112r, 112g and 112b, each of which transmits a corresponding one of red light, green light and blue light composing the white light.

Conventionally, an inherent resonant wavelength of a resonance organic EL panel is not set at a particular value. However, the inherent resonant wavelength of the organic EL panel 100 relating to the present embodiment is set within the blue region, more specifically, in the vicinity of the ultraviolet region, as shown in FIG. 5A.

Among the red, green and blue light included in the white light, wavelengths of the green light and red light are positioned further away from the inherent resonant wavelength, than that of the blue light is. When the user watches the display unit in the direction having an angle with respect to the direction perpendicular to the display unit, the intensity peaks of the green light and red light in the light received by the user are shifted to a shorter wavelength, and are lowered. The degree of these changes is smaller, when compared with the intensity peak of the blue light, which is positioned closer to the inherent resonant wavelength. Accordingly, the difference in the output intensity, which is caused by the increase in the angle, is moderate as for the green light and red light.

On the other hand, the wavelength of the blue light is positioned closer to the inherent resonant wavelength. When the user watches the display unit in the direction having an angle with respect to the direction perpendicular to the display unit, the intensity peak of the blue light in the light received by the user is shifted to a shorter wavelength, and is raised. The degree of these changes is more significant, when compared with the intensity peaks of the green light and red light. However, as the wavelength of the blue light in the received light is shifted to a shorter wavelength, part of the intensity-wavelength distribution of the blue light is included in the ultraviolet region which indicates less visibility. Therefore, the difference in the output intensity, which is caused by the increase in the angle, appears to be moderate as for the blue light.

For these reasons, even when the user watches the display unit in the direction having an angle with respect to the direction perpendicular to the display unit, a change in luminance is moderate for the blue light, green light and red light in the received light. As a consequence, only slight color shifting occurs.

Figure 5B:
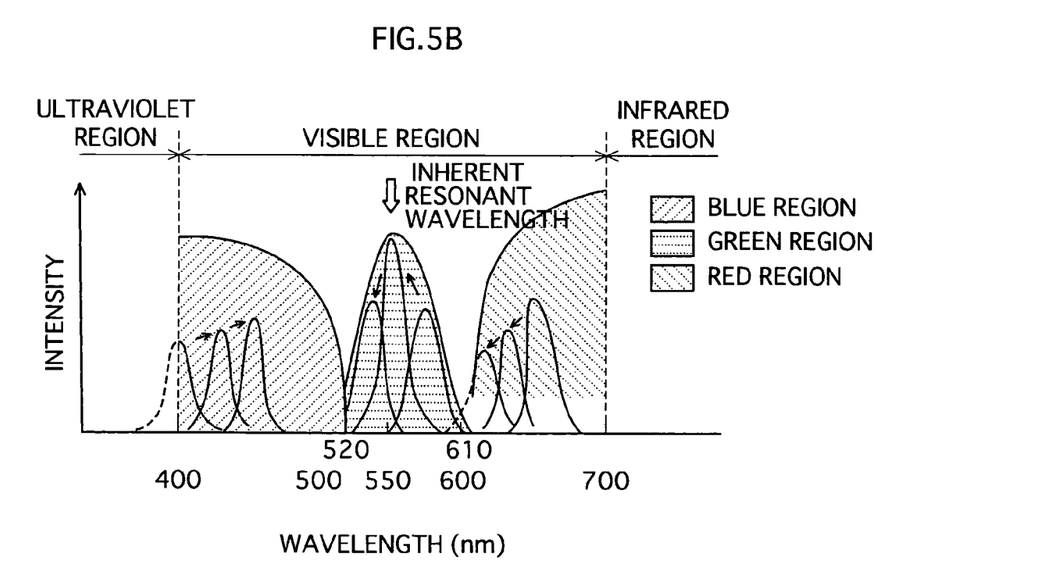

Here, it is assumed that the inherent resonant wavelength is positioned in a region other than the blue region, for example, the green region. As shown in FIG. 5B, as the angle of the direction in which the user watches the display unit of the panel 100 increases with respect to the direction perpendicular to the display unit, the output intensity of the green light significantly changes, the output intensity of the blue light increases, and the output intensity of the red light lowers. These changes enormously deteriorate the balance of the three primary colors composing the white light, thereby causing color shifting.

Furthermore, it is assumed that the inherent resonant wavelength is positioned in the red region (not illustrated in FIG. 5). As the angle of the direction in which the user watches the display unit increases with respect to the direction perpendicular to the display unit, the output intensity of the red light significantly changes, the output intensity of the blue light increases, and the output intensity of the green light also increases. These changes cause color shifting.

For the purpose of convenience, the above description of the present embodiment is made with focus on one inherent resonant wavelength. However, there are actually a plurality of inherent resonant wavelengths at certain intervals.

Here, it is possible to set an inherent resonant wavelength A in the infrared or ultraviolet region. In this case, however, an inherent resonant wavelength B or C adjacent to the inherent resonant wavelength A is thought to be positioned in the visible region. Therefore, the above description does not particularly make reference to a case where the inherent resonant wavelength is positioned in the infrared or ultraviolet region.

(Confirmation of Effects)

To confirm the effect that color shifting can be moderated if the inherent resonant wavelength is positioned in the blue region, the inventors of the present invention performed simulations. In detail, they observed changes in position, on a chromaticity diagram, of light which has passed through each of the color filters 112r, 112g and 112b, by varying the position of the inherent resonant wavelength as stated in the following.

<Setting Inherent Resonant Wavelength>

The inherent resonant wavelength is assumed to be 610 nm (the red region), 550 nm (the green region), and 515 nm (the blue region).

<Angle of Direction in which User Watches Display Unit with Respect to Direction Perpendicular to Display Unit>

The user is assumed to watch the display unit in the direction perpendicular to the display unit, in the direction at an angle of 30 degrees with respect to the perpendicular direction, and in the direction at an angle of 45 degrees with respect to the perpendicular direction.

<Results of Simulations>

Figure 6:
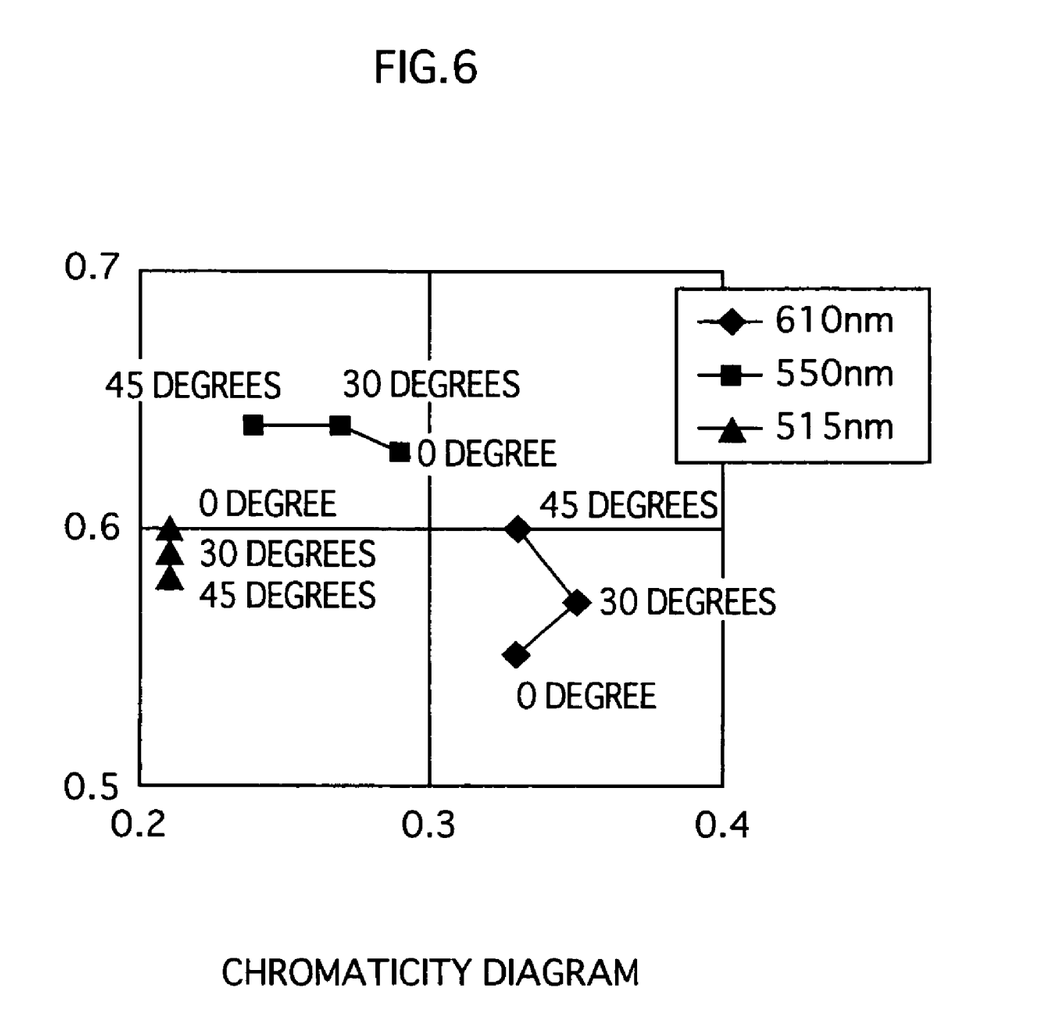
FIG. 6 shows positions, on a chromaticity diagram, of white light that is emitted from an organic layer and received by a user after having passed through a green color filter, in the embodiment of the present invention, where the positions are observed based on simulations by varying an inherent resonant wavelength and the angle of direction in which the user watches the display unit with respect to the direction perpendicular to the display unit.

FIG. 6 shows positions, on the chromaticity diagram, of the white light that is emitted from the organic layer 107 and received by the user after passing through the green color filters 112g. The results are obtained by simulations where the angle between the direction perpendicular to the display unit and the direction in which the user watches the display unit is varied and the inherent resonant wavelength is varied.

As shown in FIG. 6, when the inherent resonant wavelength is 515 nm (the blue region), a smaller change in position on the chromaticity diagram is observed in accordance with the change in the angle, in comparison with a case where the inherent resonant wavelength is set to the different values.

This means that, when the inherent resonant wavelength is 515 nm (the blue region), the change in output wavelength of the green light is limited.

Figure 7:
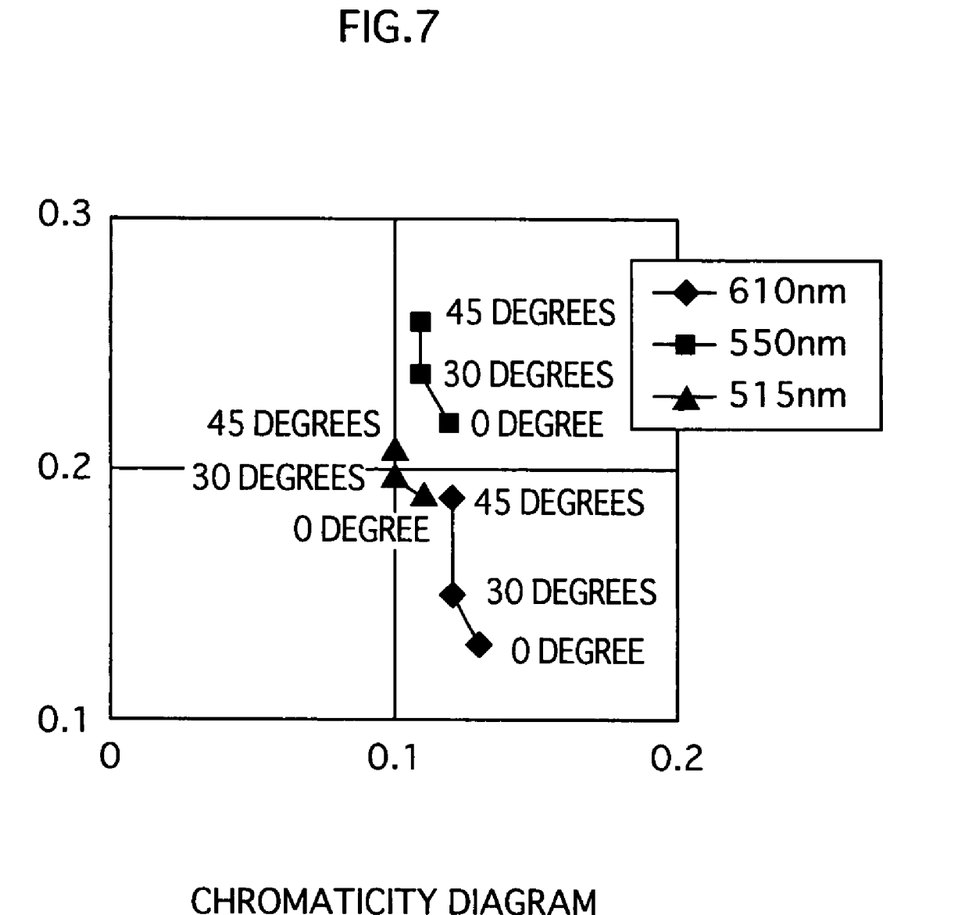
FIG. 7 shows positions, on a chromaticity diagram, of white light that is emitted from an organic layer and received by a user after having passed through a blue color filter, in the embodiment of the present invention, where the positions are observed based on simulations by varying an inherent resonant wavelength and the angle of direction in which the user watches the display unit with respect to the direction perpendicular to the display unit.

FIG. 7 shows positions, on the chromaticity diagram, of the white light that is emitted from the organic layer 107 and received by the user after passing through the blue color filters 112b. The results are obtained by simulations where the angle between the direction perpendicular to the display unit and the direction in which the user watches the display unit is varied and the inherent resonant wavelength is varied.

As shown in FIG. 7, when the inherent resonant wavelength is 515 nm (the blue region), a smaller change in position on the chromaticity diagram is observed in accordance with the change in the angle, in comparison with a case where the inherent resonant wavelength is set to the different values.

This means that, when the inherent resonant wavelength is 515 nm (the blue region), the change in output wavelength of the blue light is limited.

Figure 8:
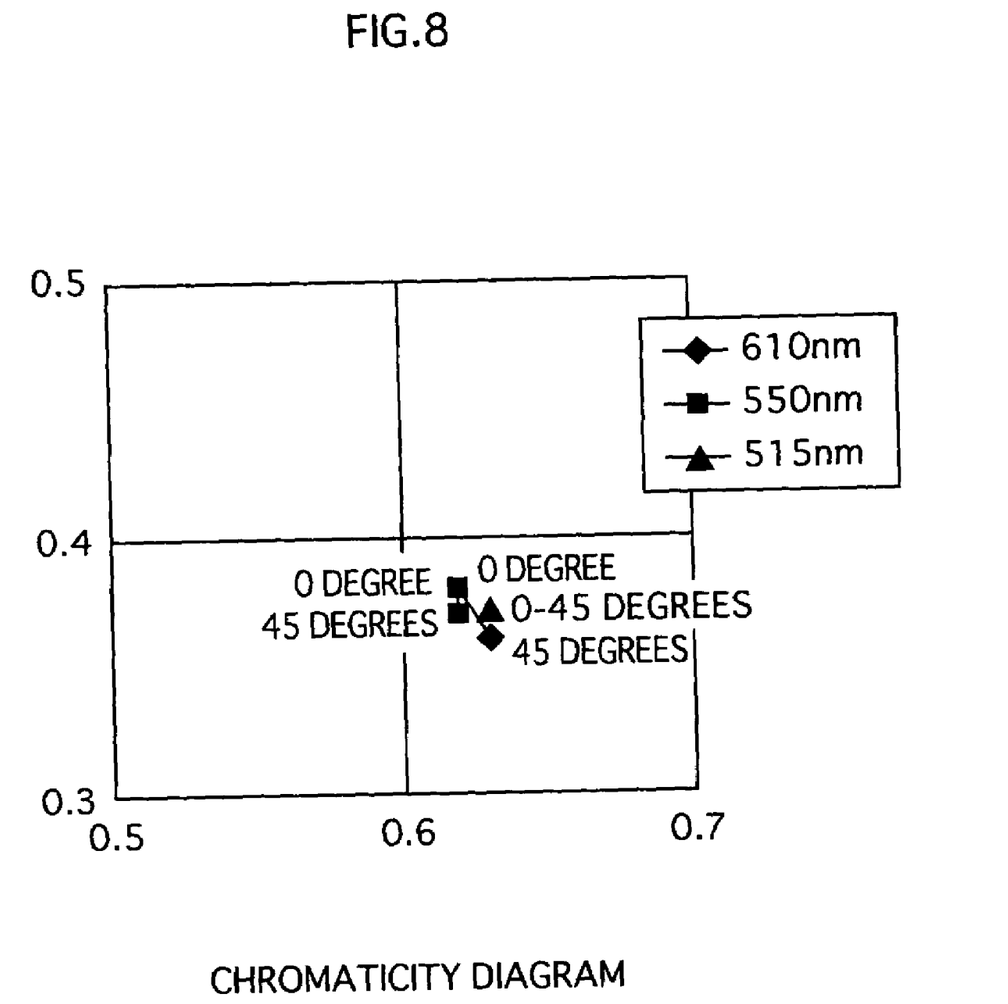
FIG. 8 shows positions, on a chromaticity diagram, of white light that is emitted from an organic layer and received by a user after having passed through a red color filter, in the embodiment of the present invention, where the positions are observed based on simulations by varying an inherent resonant wavelength and the angle of direction in which the user watches the display unit with respect to the direction perpendicular to the display unit.

FIG. 8 shows positions, on the chromaticity diagram, of the white light that is emitted from the organic layer 107 and received by the user after passing through the red color filters 112r. The results are obtained by simulations where the angle between the direction perpendicular to the display unit and the direction in which the user watches the display unit is varied and the inherent resonant wavelength is varied.

As shown in FIG. 8, irrespective of whether the inherent resonant wavelength is 610 nm (the red region), 550 nm (the green region), and 515 nm (the blue region), only a small change in position on the chromaticity diagram is observed in accordance with the change in the angle.

This means that, irrespective of the positions of the inherent resonant wavelength, the change in output wavelength of the red light is limited.

Although the present invention has been fully described by way of examples with reference to the accompanying drawings, it is to be noted that various changes and modification will be apparent to those skilled in the art. Therefore, unless otherwise such changes and modifications depart from the scope of the present invention, they should be construed as being included therein.

What is claimed is:

1. A light emitting display apparatus that achieves color display by using white light as a light source, comprising:
   a plurality of organic light emitting devices each of which includes an organic light emitting layer composed of two or more light emitting layers being stacked in a thickness direction that emit waveband lights of different colors that are complimentary to each other in producing white light, the organic light emitting device having a resonant structure so that a resonant wavelength in the thickness direction of the organic light emitting layer is positioned in the blue region of the spectrum, and outputs the white light produced by synthesizing lights that include color elements obtained from the organic light emitting layer; and
   a plurality of wavelength selection units each of which is provided on a path of the emission of the white light, the wavelength selection unit transmitting light of a particular wavelength included in the white light, wherein
   the resonant wavelength has been set such that, in the white light emitted from the plurality of organic light emitting devices, a luminance intensity distribution of a first light in the blue region (i) has a higher peak than a luminance intensity distribution of a second light in the blue region and (ii) is shifted toward an ultraviolet region, the first light being emitted in a direction deviated from the thickness direction, and the second light being emitted in the thickness direction.

2. The light emitting display apparatus of claim 1, wherein the blue region of the spectrum indicates a wavelength range of 400 nm to 520 nm, inclusive.

3. The light emitting display apparatus of claim 2, wherein the resonant wavelength falls within a range of 400 nm to 450 nm, inclusive.

4. The light emitting display apparatus of one of claims 1 to 3, wherein the wavelength selection unit is a color filter that transmits light of a corresponding one of three primary colors.

5. The light emitting display apparatus of one of claims 1 to 3, wherein at least one of a thickness of the organic light emitting layer, a refractive index of the organic light emitting layer, and a phase shift $\phi$ of the organic light emitting layer is adjusted so that the resonant wavelength in the thickness direction of the organic light emitting layer is positioned in the blue region of the spectrum.

6. The light emitting display apparatus of one of claims 1 to 3, wherein each of the wavelength selection units has a thickness of no less than 1 μm and no more than 10 μm.

* * * * *